United States Patent
Shimura et al.

(10) Patent No.: US 8,035,344 B2
(45) Date of Patent: Oct. 11, 2011

(54) BATTERY SYSTEM INCLUDING TWO OR MORE UNIT CELLS ELECTRICALLY CONNECTED IN SERIES

(75) Inventors: Jusuke Shimura, Kanagawa (JP); Yoshiaki Inoue, Aichi (JP)

(73) Assignee: Sony Corporation, Tokyo (JP)

( * ) Notice: Subject to any disclaimer, the term of this patent is extended or adjusted under 35 U.S.C. 154(b) by 831 days.

(21) Appl. No.: 12/105,736

(22) Filed: Apr. 18, 2008

(65) Prior Publication Data
US 2008/0258684 A1 Oct. 23, 2008

(30) Foreign Application Priority Data
Apr. 20, 2007 (JP) .................. 2007-111446

(51) Int. Cl.
*H01M 10/46* (2006.01)
(52) U.S. Cl. ...................................... 320/122
(58) Field of Classification Search ............. 320/101, 320/107, 116, 117, 122
See application file for complete search history.

(56) References Cited

U.S. PATENT DOCUMENTS

| | | | | |
|---|---|---|---|---|
| 4,719,401 A | * | 1/1988 | Altmejd | 320/122 |
| 5,821,733 A | * | 10/1998 | Turnbull | 320/116 |
| 6,388,423 B1 | * | 5/2002 | Schilleci, Jr. | 320/122 |
| 2006/0057447 A1 | | 3/2006 | Yamase et al. | |

FOREIGN PATENT DOCUMENTS
JP 2006114481 4/2006

* cited by examiner

*Primary Examiner* — Edward Tso
(74) *Attorney, Agent, or Firm* — K&L Gates LLP

(57) ABSTRACT

A battery system capable of inhibiting a reverse voltage applied to a unit cell that has lost the electromotive force without active control is provided. The battery system include two or more unit cells electrically connected in series, and a rectification section that is composed of at least one of an electronic device having a rectification function and an interface having a rectification action, and is electrically connected to the respective two or more unit cells in parallel.

7 Claims, 14 Drawing Sheets

;
BATTERY SYSTEM INCLUDING TWO OR MORE UNIT CELLS ELECTRICALLY CONNECTED IN SERIES

CROSS REFERENCES TO RELATED APPLICATIONS

The present application claims priority to Japanese Patent Application JP 2007-111446 filed in the Japanese Patent Office on Apr. 20, 2007, the entire contents of which is being incorporated herein by reference.

BACKGROUND

The present application relates to a battery system in which 2 or more unit cells are electrically connected in series, particularly to a battery system suitable for a fuel cell, a solar cell and the like.

In the case where a battery is used as a power source, it is often the case that a necessary quantity of unit cells is connected in series to obtain a high voltage in order to obtain a voltage necessary for a load. In particular, in a fuel cell or a solar cell, the electric power generation voltage per unit cell is low. Thus, it is general that a plurality of unit cells (electric power generation parts) are connected in series to configure a battery system.

SUMMARY

However, in such a battery system, the output varies among the plurality of unit cells. When the electromotive force of even one of the unit cells becomes 0, such a relevant cell becomes a resistance component. In the result, the output capable of being extracted outward is decreased. In addition, it causes accelerated deterioration of the relevant unit cell itself. The output variation among the plurality of unit cells is caused by variation of the fuel supply amount in the case of the fuel battery, and by the fact that part of the plurality of unit cells goes into the shade in the case of the solar cell. It is considerably difficult to avoid such a cause itself.

In the past, a fuel cell system in which a comparator and a logic circuit are combined, and the outputs of a plurality of unit cells are controlled actively has been proposed (for example, refer to Japanese Unexamined Patent Application Publication No. 2006-114481). However, in such an existing configuration, in addition to that the complicated circuit is demanded, the number of wirings should be increased to detect the voltage of each unit cell.

In view of the foregoing, it is desirable to provide a battery system capable of suppressing the reverse voltage applied to a unit cell that has lost the electromotive force without active control.

According to an embodiment, there is provided a battery system including two or more unit cells electrically connected in series; and a rectification section that is composed of at least one of an electronic device having a rectification function and an interface having a rectification action and is electrically connected to the respective two or more unit cells in parallel.

In the battery system according to the embodiment, when an electromotive force of a given unit cell becomes 0, a current bypasses such a unit cell, and is flown to the next unit cell through a rectification section electrically connected to such a unit cell in parallel. Therefore, a reverse voltage applied to such a bypassed unit cell is inhibited.

In the battery system according to the embodiment, the rectification section that is composed of at least one of the electronic device having a rectification function and the interface having a rectification action is electrically connected in parallel to the respective two or more unit cells electrically connected in series. Thus, the both ends of the respective unit cells may be short circuited by the rectification sections. When an electromotive force of a given unit cell becomes 0, a detour of a current is formed. Therefore, a reverse voltage applied to a unit cell that has lost the electromotive force may be inhibited without active control.

Additional features and advantages are described herein, and will be apparent from the following Detailed Description and the figures.

DETAILED DESCRIPTION

Embodiments will be hereinafter described in detail with reference to the drawings.

First Embodiment

Figure 1:
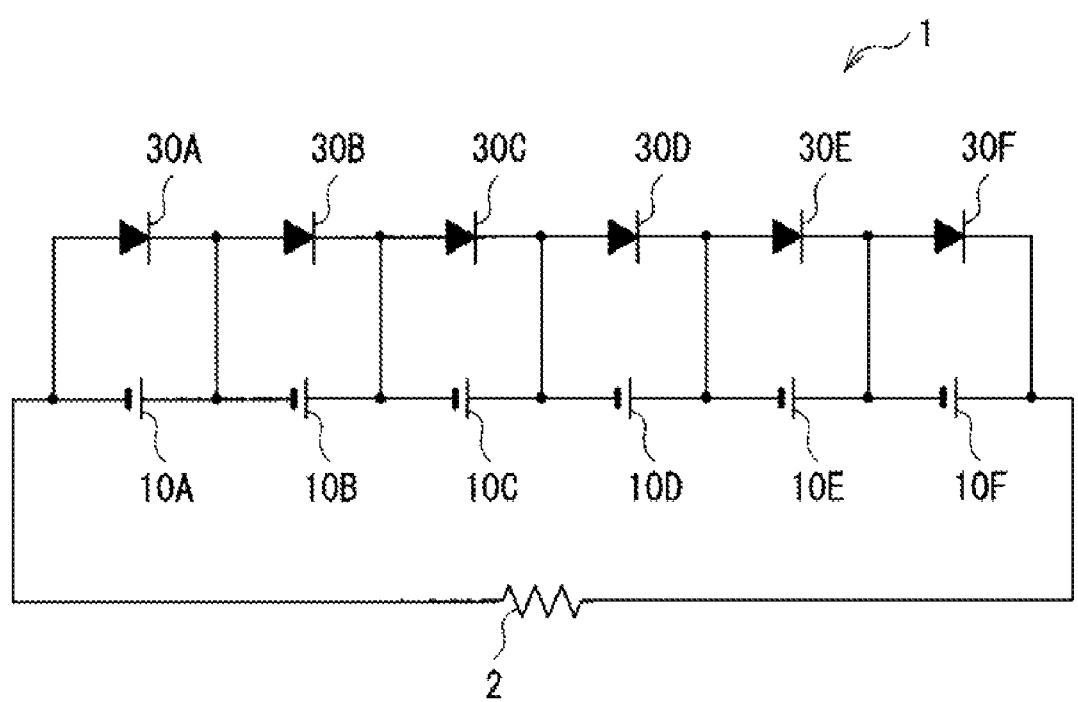
FIG. 1 is a circuit diagram showing a configuration of a battery system according to a first embodiment.

FIG. 1 shows a configuration of a battery system according to a first embodiment. A battery system 1 is a fuel cell system used for a mobile device such as a mobile phone and a PDA (Personal Digital Assistant), a notebook PC (Personal Computer) and the like. In the battery system 1, 2 or more (for example, 6) unit cells 10A to 10F are electrically connected in series, and electric energy generated in the unit cells 10A to 10F is supplied to a load (external circuit) 2.

The unit cells 10A to 10F are, for example, respectively a DMFC (Direct Methanol Fuel Cell) for generating electric power by reaction between methanol and oxygen, which are electrically connected to each other in series by a conductive connection member 20 described later. Electronic devices having a rectification function, specifically speaking, rectification sections 30A to 30F composed of a rectifier are respectively electrically connected to the respective unit cells 10A to 10F in parallel. Thereby, in the battery system 1, the reverse voltage applied to a unit cell that has lost the electromotive force is suppressed without active control.

The voltage drop amount in the rectification sections 30A to 30F is preferably, for example, 0.5 V or less, more preferably 0.3 V or less, and much more preferably 0.1 V or less. Thereby, the voltage drop amount is able to be small as much as possible, and leakage current is able to be decreased. To that end, the rectifier composing the rectification sections 30A to 30F is preferably a Schottky diode, because the Schottky diode enables to significantly reduce the voltage drop amount compared to a case that other type of diode is used.

Figure 2:
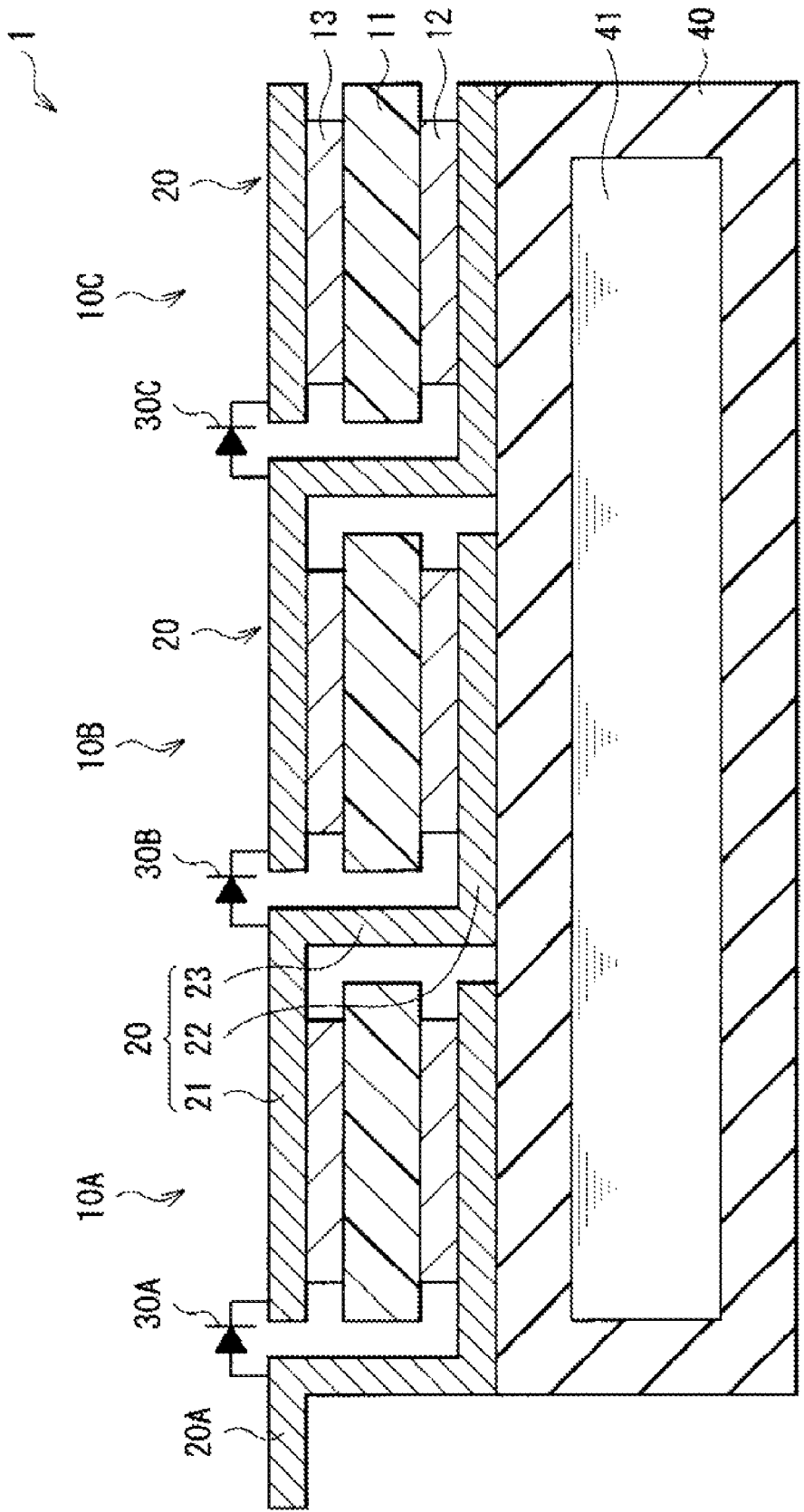
FIG. 2 is a cross section showing a configuration example of the battery system shown in FIG. 1.
Figure 3:
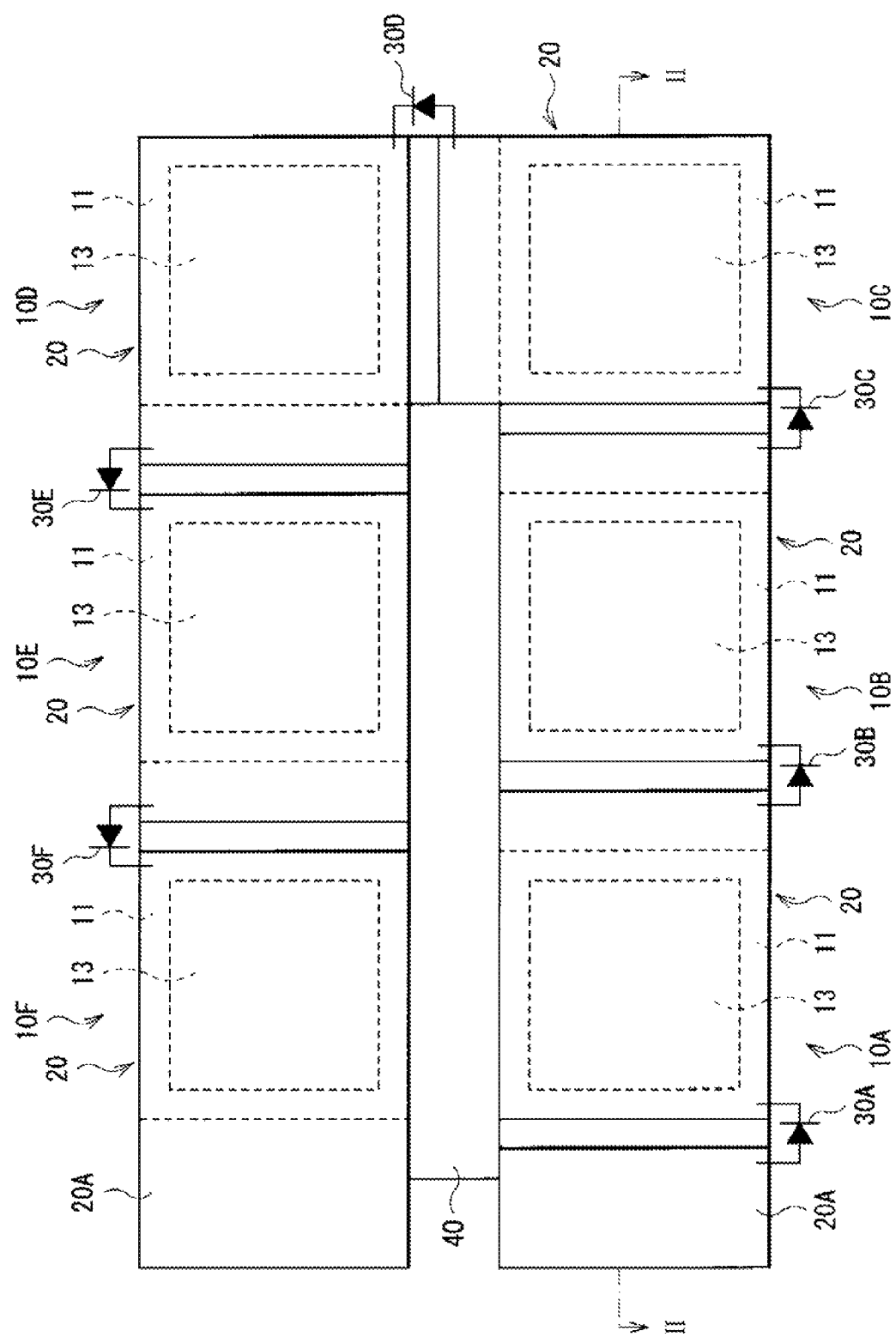
FIG. 3 is a plan view showing a configuration of the battery system shown in FIG. 2 viewed from the unit cell side.

FIG. 2 and FIG. 3 show a configuration example of the unit cells 10A to 10F. The unit cells 10A to 10F are arranged, for example, in a matrix state of 3 rows by 2 columns in the in-plane direction. The unit cells 10A to 10F have a plane laminated structure in which the unit cells 10A to 10F are electrically connected to each other in series by the plurality of connection members 20. A terminal 20A as an extension section of the connection member 20 is attached to the unit cells 10A and 10F. A fuel tank 40 containing a liquid fuel (for example, methanol water) 41 is provided below the unit cells 10A to 10F.

The unit cells 10A to 10F respectively have a fuel electrode 12 and an oxygen electrode 13 that are oppositely arranged with an electrolyte film 11 in between.

The electrolyte film 11 is made of, for example, a proton conductive material having a sulfonic acid group ($—SO_3H$). As the proton conductive material, a hydrocarbon system proton conductive material such as polyperfluoroalkyl sulfonic acid system proton conductive material (for example, "Nafion (registered trademark)," of Du Pont) and polyimide sulfonic acid, a fullerene system proton conductive material or the like is cited.

The fuel electrode 12 and the oxygen electrode 13 have a structure in which a catalyst layer containing a catalyst such as platinum (Pt) and ruthenium (Ru) is formed on a current collector made of a carbon paper or the like. The catalyst layer is made of a material in which a support body such as carbon black that supports the catalyst is dispersed in a polyperfluoroalkyl sulfonic acid system proton conductive material or the like. A not-shown air supply pump may be connected to the oxygen electrode 13. Otherwise, the oxygen electrode 13 may be communicated with outside through an opening (not shown) provided in the connection member 20, and air, that is, oxygen may be provided by natural ventilation.

The connection member 20 has a bend 23 between two flat sections 21 and 22. One flat section 21 is in contact with the fuel electrode 12 of one unit cell (for example, 10A), the other flat section 22 is in contact with the oxygen electrode 13 of an adjacent unit cell (for example, 10B). The connection member 20 electrically connects adjacent two unit cells (for example, 10A and 10B) in series, and has a function as a current collector for collecting electricity generated in the respective unit cells 10A to 10F. Such a connection member 20 is, for example, 150 μm thick; is made of copper (Cu), nickel (Ni), titanium (Ti), or stainless steel (SUS); and may be plated by gold (Au), platinum (Pt) or the like. Further, the connection member 20 has an opening (not shown) for respectively supplying a fuel and air to the fuel electrode 12 and the oxygen electrode 13. For example, the opening is composed of a mesh such as an expand metal, a punching metal or the like. The bend 23 may be previously provided with bend processing to match with the thickness of the unit cells 10A to 10F. Otherwise, if the connection member 20 is made of a mesh being 200 μm thick or less having flexibility, the bend 23 may be formed by being bent in the manufacturing process. Such a connection member 20 is connected to the unit cells 10A to 10F, for example, by screwing a sealing material such as PPS (polyphenylene sulphide) and silicon rubber provided on the periphery of the electrolyte film 11 on the connection member 20.

The fuel tank 40 is composed, for example, of a container (for example, a plastic bag) with a volume changeable without air bubble or the like entering therein even if the liquid fuel 41 is increased or decreased; and a case (structure) in the shape of a rectangular solid covering the container. In the fuel tank 40, a fuel supply pump (not shown) for vacuuming the liquid fuel 41 in the fuel tank 40 and exhausting the vacuumed liquid fuel from a nozzle (not shown) is provided on the central upper side. The liquid fuel exhausted from the nozzle is diffused by pressurization by the pump, capillary action or the like on a fuel diffusion plate (not shown) provided on the top face of the fuel tank 40, and then is supplied to the respective unit cells 10A to 10F. The liquid fuel 41 in a vaporized state may be supplied to the unit cells 10A to 10F, or the liquid fuel 41 in a liquid state may be in contact with the fuel electrode 12.

The battery system 1 is manufactured, for example, as follows.

First, the electrolyte film 11 made of the foregoing material is sandwiched between the fuel electrode 12 and the oxygen electrode 13 made of the foregoing material and thermally compressed. Thereby, the fuel electrode 12 and the oxygen electrode 13 are joined to the electrolyte film 11, and the unit cells 10A to 10F are formed.

Figure 4:
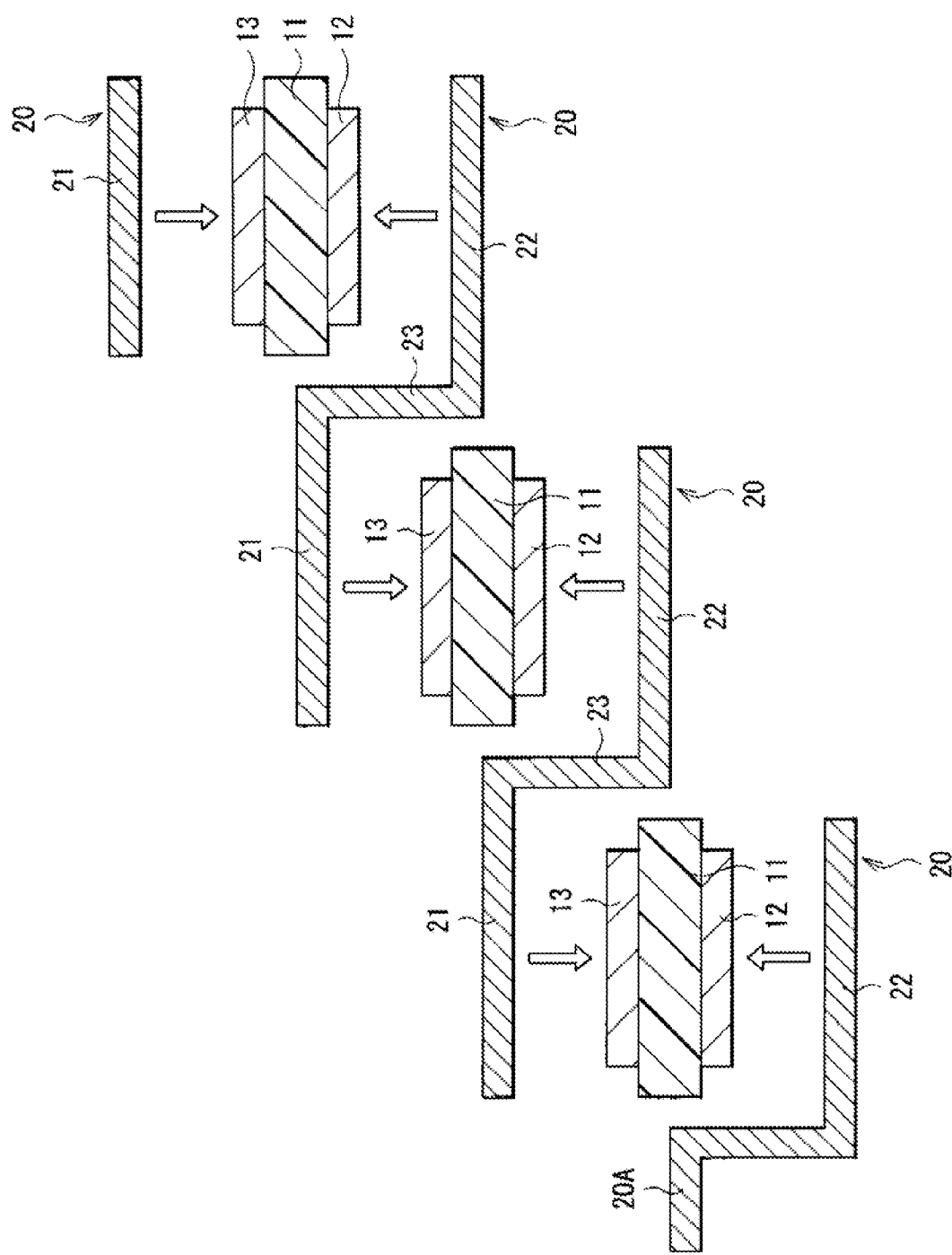
FIG. 4 is a view for explaining a method of manufacturing the battery system shown in FIG. 3.
Figure 5:
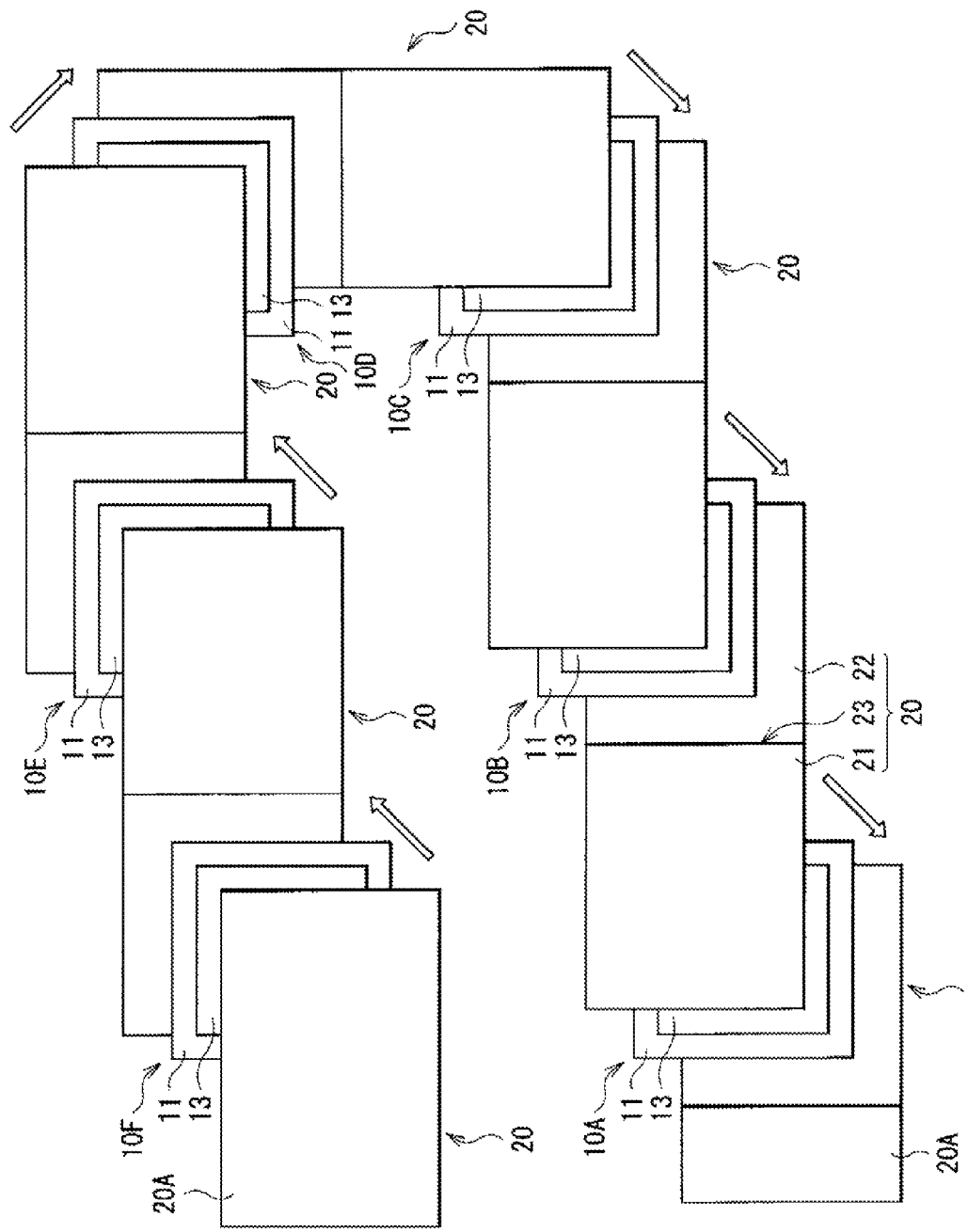
FIG. 5 is a view for explaining a method of manufacturing the battery system shown in FIG. 3.
Figure 6:
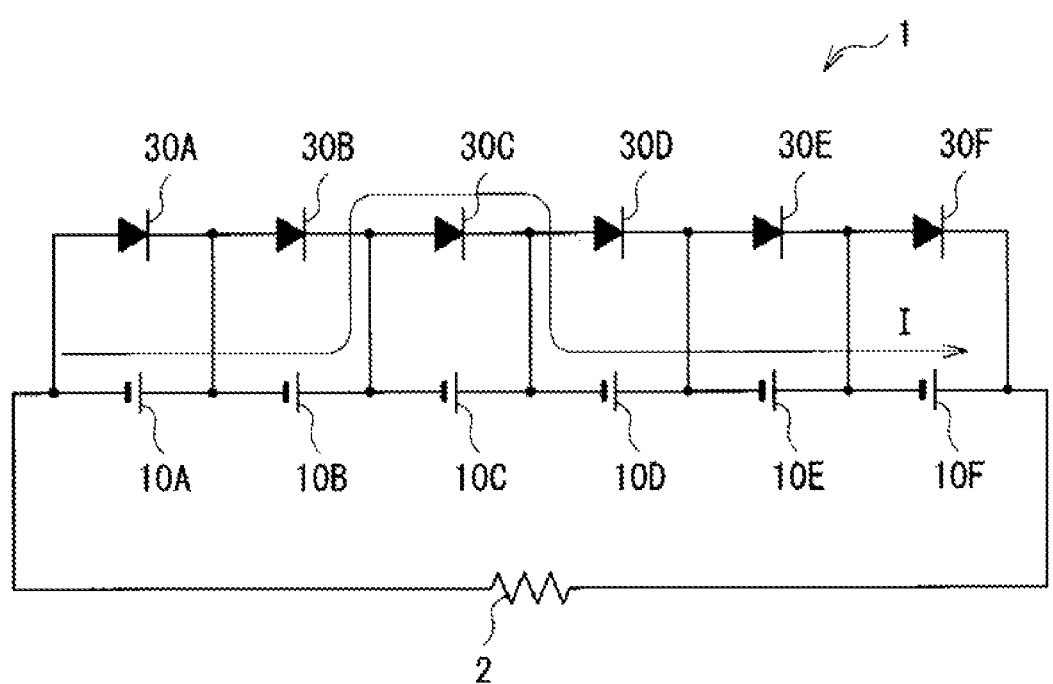
FIG. 6 is a diagram for explaining an action of the rectification section shown in FIG. 1.

Next, the connection member 20 made of the foregoing material is prepared. As shown in FIG. 4 and FIG. 5, 6 pieces of unit cells 10A to 10F are arranged in a matrix state of 3 rows by 2 columns, and electrically connected in series by the connection member 20. At the same time, the foregoing electronic device having a rectification function, specifically speaking, the rectification sections 30A to 30F composed of a rectifier are respectively electrically connected to the respective unit cells 10A to 10F in parallel. The terminal 20A is attached to the unit cells 10A and 10F. On the periphery of the electrolyte film 11, the sealing material (not shown) made of the foregoing material is provided, and the sealing material is fixed on the bend 23 of the connection member 20 by screw fastening.

After that, on the fuel electrode 12 side of the linked unit cells 10A to 10F, the fuel tank 40 in which the liquid fuel 41 is contained and the fuel supply pump (not shown) and the like are provided is arranged. Consequently, the battery system 1 shown in FIG. 1 to FIG. 3 is fabricated.

In the battery system 1, the fuel is supplied to the fuel electrode 12 of the respective unit cells 10A to 10F, reaction is initiated to generate a proton and an electron. The proton is moved to the oxygen electrode 13 through the electrolyte film 11, is reacted with an electron and oxygen to generate water. Thereby, part of chemical energy of the liquid fuel 41, that is, methanol is converted to electric energy. The electric energy is collected by the connection member 20, extracted as a current, and the external circuit 2 is thereby driven. At this time, for example, when the electromotive force of the unit cell 10C becomes 0 resulting from variation of the supply amount of the liquid fuel 41 or the like, as shown in FIG. 6, current C bypasses the unit cell 10C, and is flown to the next unit cell 10D through the rectification section 31C electrically connected to the unit cell 10C in parallel. Thus, the reverse voltage applied to the unit cell 10C having reduced output is inhibited.

As described above, in this embodiment, the electronic device having a rectification function, specifically speaking, the rectification sections 30A to 30F composed of a rectifier are electrically connected in parallel to the respective unit cells 10A to 10F electrically connected in series. Thus, the both ends of the respective unit cells 10A to 10F is short-circuited by the rectification sections 30A to 30F. In the case where the output of a given unit cell is decreased and the electromotive force thereof becomes 0, a detour of the current is formed. Thus, the reverse voltage applied to the unit cell that has lost the electromotive force is inhibited without active control. Thus, the output capable of being extracted outward is prevented from being decreased, and the unit cell that has lost the electromotive force is prevented from being acceleratively deteriorated. Further, the existing complicated circuit to control the output of the respective unit cells 10A to 10F becomes unnecessary, and a large number of wirings and the like to detect and monitor the voltage of the respective unit cells 10A to 10F become unnecessary. Accordingly, the structure is simplified, and thus it is extremely advantageous to attain downsizing.

In particular, the voltage drop amount in the rectification sections 30A to 30F is 0.5 V or less. Thus, it is possible to reduce the voltage drop amount as much as possible, and to decrease a leakage current.

Further, in particular, since the rectification sections 30A to 30F are composed of the Schottky diode. Thereby, the voltage drop amount is significantly decreased compared to that of other types of diodes.

Second Embodiment

Figure 7:
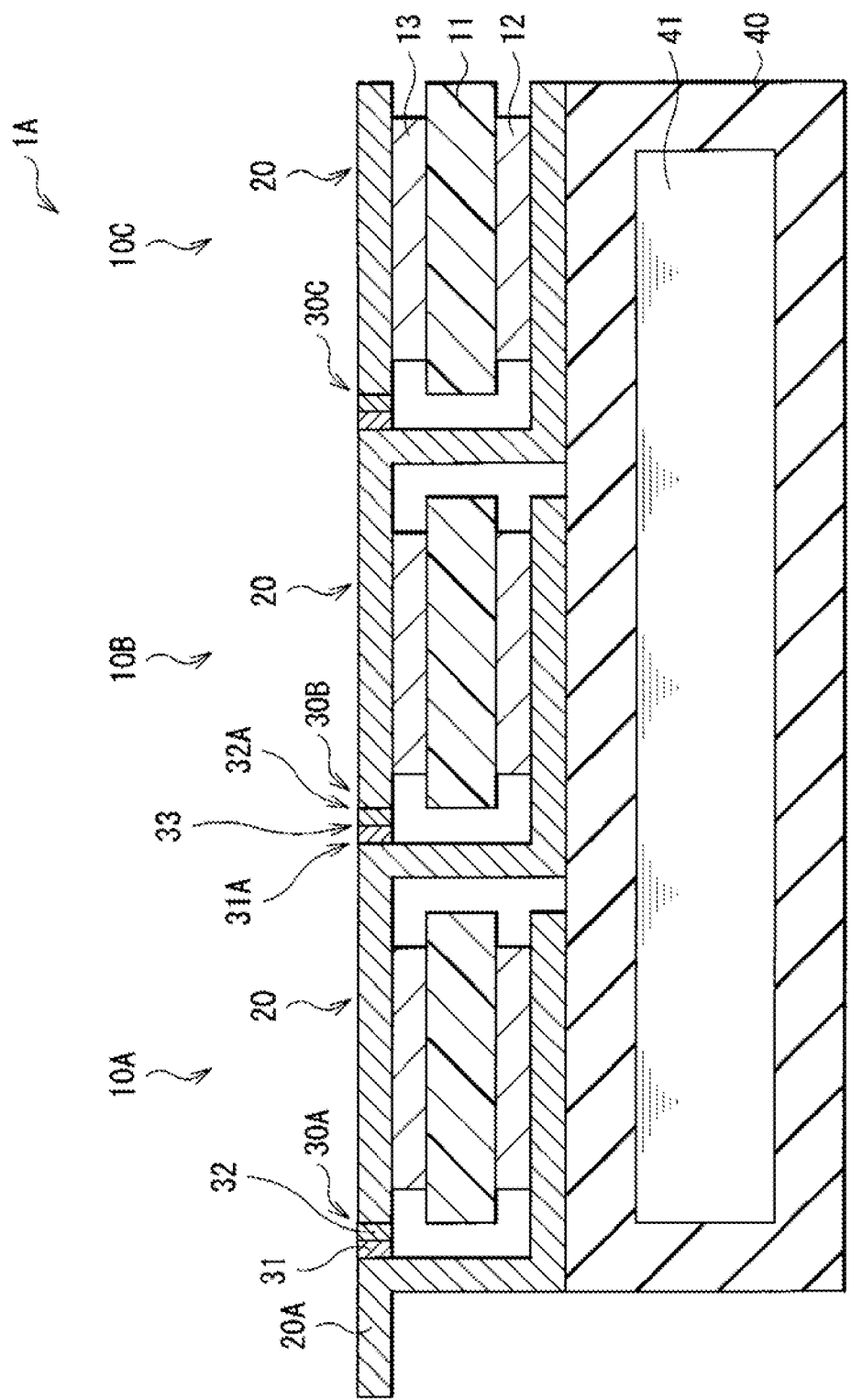
FIG. 7 is a cross section showing a configuration of a battery system according to a second embodiment.
Figure 8:
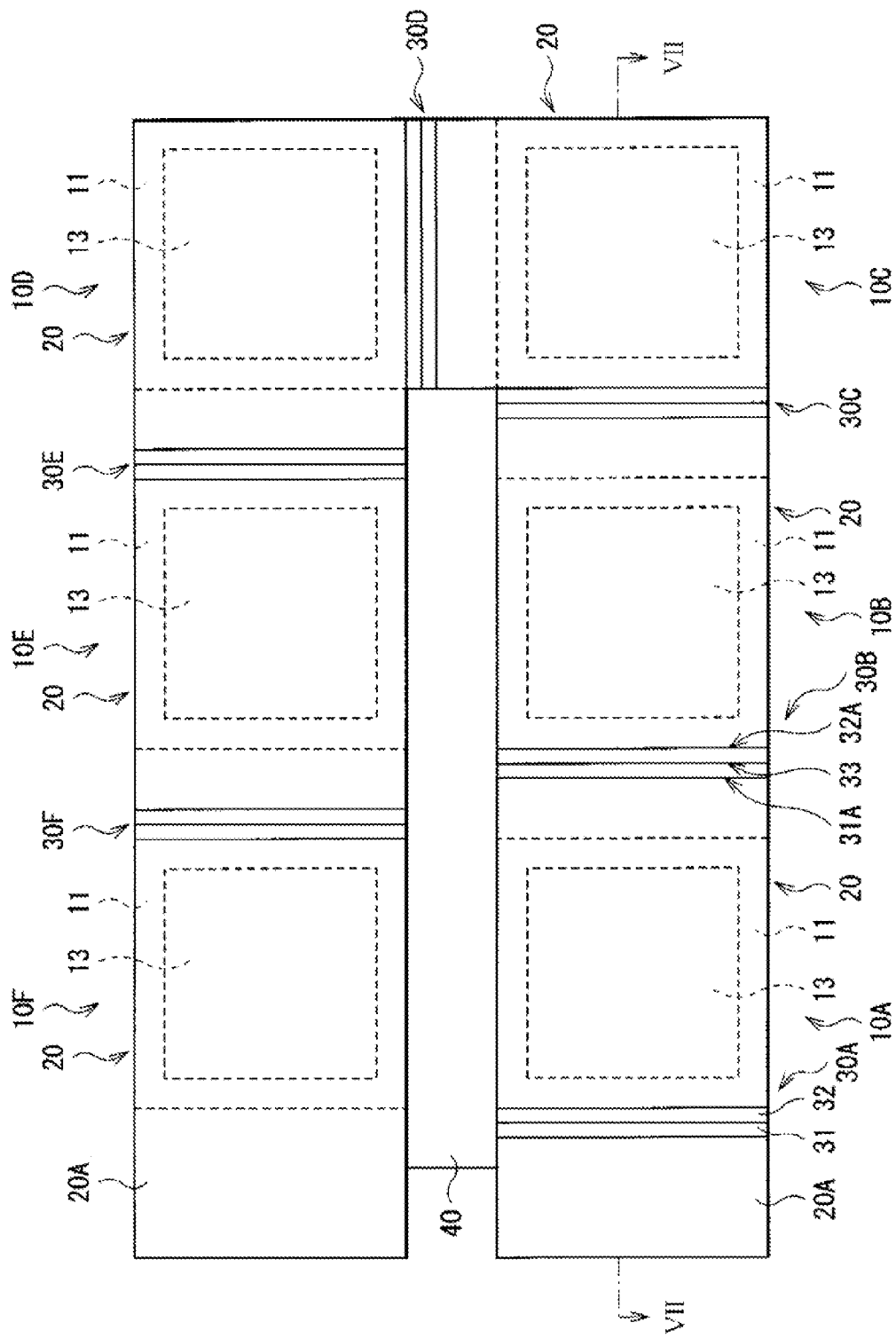
FIG. 8 is plan view showing a configuration of the battery system shown in FIG. 7 viewed from the unit cell side.

FIG. 7 and FIG. 8 show a battery system according to a second embodiment. A battery system 1A has a structure similar to that of a battery system 1 described in the foregoing first embodiment, except that the rectification sections 30A to 30F are composed of an interface having a rectification action, particularly speaking, a metal-semiconductor interface (Schottky interface). Therefore, a description will be given by using the same referential symbols for the corresponding components.

The unit cells 10A to 10F are configured as in the first embodiment.

A metal layer 31 and a semiconductor layer 32 are provided between the flat sections 21 of the connection member 20. The metal layer 31 contains metal (second metal) M2 different from metal (first metal) M1 composing the connection member 20, and is joined to the flat section 21 of one connection member 20. The semiconductor layer 32 is made of n-type semiconductor nS, and jointed to the flat section 21 of adjacent other connection member 20. A Schottky interface 33 is formed between the semiconductor layer 32 and the connection member 20 to which the semiconductor layer 32 is joined or the metal layer 31. The Schottky interface 33 forms the rectification sections 30A to 30F of this embodiment. Thereby, in the battery system 1A, as in the first embodiment, the reverse voltage applied to a unit cell that has lost the electromotive force is inhibited without active control.

Depending on the types of the metals M1 and M2 and the n-type semiconductor nS, the position of the metal layer 31 may be counterchanged with the position of the semiconductor layer 32. Further, the semiconductor layer 32 may be made of a p-type semiconductor instead of the n-type semiconductor.

For example, in the case of the arrangement relation shown in FIG. 7 and FIG. 8, the metal M1 may be magnesium (Mg), the metal M2 may be gold (Au), and the n-type semiconductor nS may be n-type silicon (Si). In this case, the interface between the metal layer 31 and the semiconductor layer 32 is the Schottky interface 33. Further, an ohmic interface 31A is formed between the metal layer 31 and the connection member 20. An ohmic interface 32A is formed between the semiconductor layer 32 and the connection member 20.

Figure 9:
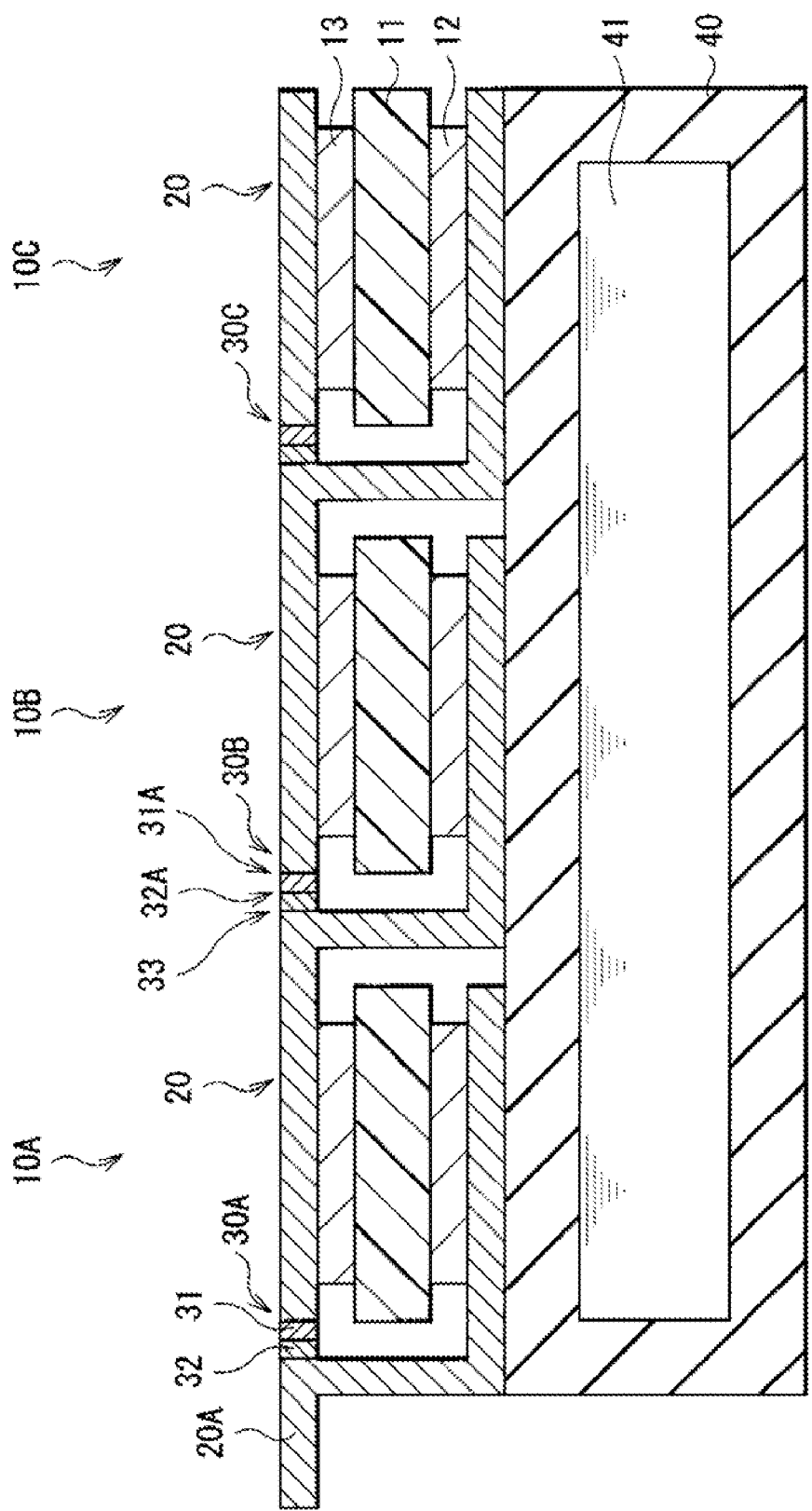
FIG. 9 is a cross section showing another configuration example of the battery system shown in FIG. 7.

FIG. 9 shows another arrangement relation among the metal layer 31, the semiconductor layer 32, and the Schottky interface 33. In this case, the metal M1 is gold (Au), the metal M2 is magnesium (Mg), and the n-type semiconductor nS is n-type silicon (Si). The interface between the semiconductor layer 32 and the connection member 20 is the Schottky interface 33. Further, the interface between the metal layer 31 and the connection member 20 is the ohmic interface 31A. The interface between the semiconductor layer 32 and the metal layer 31 is the ohmic interface 32A.

The voltage drop amount in the rectification sections 30A to 30F is preferably, for example, 0.5 V or less, more preferably 0.3 V or less, and much more preferably 0.1 V or less, as in the rectification sections 30A to 30F of the first embodiment.

The fuel tank 40 and the liquid fuel 41 are configured as in the first embodiment.

The battery system 1A may be manufactured, for example, as follows. A description will be hereinafter given of a method of manufacturing the battery system 1A in the case that the metal M1 is gold (Au), the metal M2 is magnesium (Mg), the n-type semiconductor nS is n-type silicon (Si), and the interface between the semiconductor layer 32 and the connection member 20 is the Schottky interface 33 as shown in FIG. 9.

First, the fuel electrode 12 and the oxygen electrode 13 are joined to the electrolyte film 11 to form the unit cells 10A to 10F in the same manner as that of the first embodiment.

Next, the connection member 20 made of gold (Au), gold-plated copper (Cu), nickel (Ni), titanium (Ti) or the like as the metal M1 is prepared. At an end of the connection member 20, the metal layer 31 made of magnesium (Mg) as the metal M2 is formed by, for example, pattern evaporation, and the ohmic interface 31A is formed between the metal layer 31 and the connection member 20. Subsequently, the semiconductor layer 32 made of a piece of n-type silicon as the n-type semiconductor nS is joined to the portion where the metal M2 of the metal layer 31 is exposed by, for example, ultrasonic welding, and the ohmic interface 32A is formed between the metal layer 31 and the semiconductor layer 32. After that, the piece of n-type silicon is connected to another connection member 20 to form the Shottky interface 33. Thereby, the rectification sections 30A to 30F composed of the Shottky interface 33 is formed between the semiconductor layer 32 and the connection member 20.

After the rectification sections 30A to 30F are formed, in the same manner as that of the first embodiment, 6 pieces of the unit cells 10A to 10F are arranged in a matrix state of 3 rows by 2 columns, and electrically connected in series by the connection member 20. At the same time, the rectification sections 30A to 30F composed of the Shottky interface 33 are respectively electrically connected to the respective unit cells 10A to 10F in parallel.

After that, the fuel tank 40 is arranged on the fuel electrode 12 side. Consequently, the battery system 1a shown in FIG. 1, FIG. 7, and FIG. 8 is fabricated.

The battery system 1A has an action similar to that of the battery system 1 according to the first embodiment, and provides an effect similar thereto.

Third Embodiment

Figure 10:
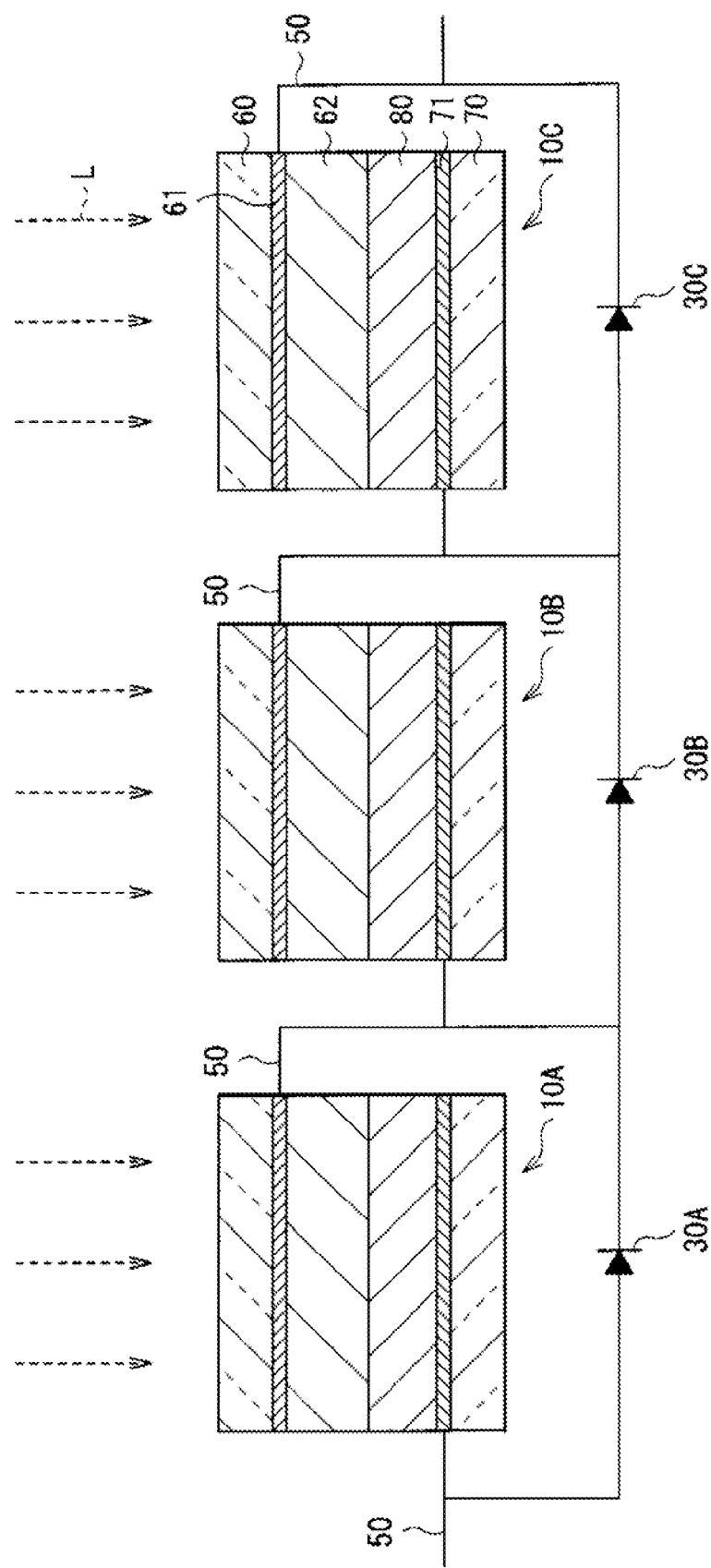
FIG. 10 is a cross section showing a configuration of a battery system according to a third embodiment.

FIG. 10 shows a configuration of a battery system 1B according to a third embodiment. The battery system 1B is configured as in the battery system 1 according to the first embodiment, except that the battery system 1B is a dye-sensitized solar cell system used for, for example, a mobile device such as a mobile phone and a PDA or a notebook PC; and the unit cells 10A to 10F (among them, since the unit cells 10D to 10F are not shown in FIG. 10, refer to FIG. 1 for them) are electrically connected to each other in series by a conductor 50. Therefore, a description will be given by using the same referential symbols for the corresponding components.

In the respective unit cells 10A to 10F, for example, a transparent substrate 60 and a counter substrate 70 made of glass, transparent plastic or the like are oppositely arranged, and an electrolyte layer 80 is provided between the transparent substrate 60 and the counter substrate 70. On the transparent substrate 60, a transparent electrode 61 and a semiconductor electrode 62 are sequentially formed. On the counter substrate 70, a counter electrode 71 is formed.

The transparent electrode 61 is made of, for example, a transparent conductive film such as ITO (Indium Tin Oxide).

In the semiconductor electrode 62, for example, the average particle diameter of the initial particle is preferably about from 1 nm to 200 nm, more preferably about from 5 nm to 100 nm. The semiconductor electrode 62 is made of an element semiconductor such as silicon, a compound semiconductor, or an oxide semiconductor. Further, the semiconductor electrode 62 is preferably an n-type semiconductor in which a conduction-band electron becomes a carrier when photoexcited to provide an anode current. Specific examples include a metal oxide semiconductor such as $TiO_2$, $MgO$, $ZnO$, $WO_3$, $Nb_2O_5$, $TiSrO_3$, and $SnO_2$. Specially, $TiO_2$ (having anatase structure) is preferable. The type of semiconductor is not limited to the foregoing semiconductors. Further, a mixture of two or more of the foregoing semiconductors may be used. The semiconductor electrode 62 may be a mixture of particles having an average particle diameter different from each other.

The semiconductor electrode 62 supports a dye having a sensitization action. As the dye, for example, a xanthene system dye such as bipyridine, a phenanthrene derivative, rhodamine B, rose bengal, eosin, and erythrosin; a cyanine system dye such as quinocyanine and cryptocyanine; a basic colorant such as phenosafranine, Capri blue, thiocyne, and methylene blue; a porphyrin system compound such as chlorophyll, zinc porphyrin, and magnesium porphyrin; azo colorant, a phthalocyanine compound, a coumarin system compound, an anthraquinone system dye, and a polycyclic quinone system dye is cited. Further, the dye may be a complex compound formed with a metal such as ruthenium (Ru), zinc (Zn), platinum (Pt), and palladium (Pd). Specially, a Ru bipyridine complex compound is preferable since the Ru bipyridine complex compound has the high quantum yield. Two or more of the foregoing dyes may be used by mixing.

The counter electrode 71 is made of, for example, platinum (Pt). At least one of an electrode and a contact layer (not shown either) may be provided between the counter electrode 71 and the counter substrate 70.

The electrolyte layer 80 is a layer in which at least one substance system (redox system) that reversibly initiates change of oxidation state and reduction state is dissolved in an electrolyte. As an example of the redox system, for example, halogens such as $I^-/I_3^-$ and $Br^-/Br_2^-$; a pseudo-halogens such as quinone/hydroquinone and $SCN^-/(SCN)_2$; iron (II) ion/iron (III) ion, and copper (I) ion/copper (II) ion is cited, but examples are not limited thereto.

The electrolyte may be a liquid electrolyte, a polymer electrolyte in which the liquid electrolyte is contained in a polymer material (gel electrolyte), a polymer solid electrolyte, or an inorganic solid electrolyte. Specifically, a combination of iodine ($I_2$) and a metal iodide or an organic iodide; a combination of bromine ($Br_2$) and a metal bromide or an organic bromide; a sulfur compound such as ferrocyanic salt/ferricyanic salt and ferrocene/ferricinium ion; a viologen dye, and hydroquinone/quinone is cited. As a cation of the metal compound, Li, Na, K, Mg, Ca, Cs and the like is cited. As a cation of the organic compound, a quaternary ammonium compound such as tetraalkylammoniums, pyrridiniums, and imidazoliums is suitable. However, the examples are not limited thereto, and two or more thereof may be used by mixing. Specially, an electrolyte that is a combination of $I_2$ and an ionic liquid such as LiI, NaI, imidazolium iodide, and quaternary ammonium iodide is preferable. The concentration of the electrolyte salt is preferably from 0.05 M to 5 M to the solvent, and much more preferably from 0.2 M to 1 M to the solvent. The concentration of $I_2$ or $Br_2$ is preferably, for example, from 0.0005 M to 1 M, and more preferably from 0.001 M to 0.1 M. To improve the open voltage, various additives such as 4-tert-butylpyridine and carboxylic acid may be added.

As the solvent, for example, a nitrile system such as acetonitrile, a carbonate system such as propylene carbonate and ethylene carbonate, gamma butyrolactone, pyridine, dimethyl acetamide or other polar solvent, an ambient temperature molten salt such as methyl propyl imidazolium-iodine, or a mixture thereof is cited. More generally, the solvent may be water, alcohols, ethers, esters, ester carbonates, lactones, carboxylic esters, triester phosphates, heterocyclic compounds, nitrites, ketones, amides, nitromethane, halogenated hydrocarbon, dimethylsulfoxide, sulfolane, N-methylpyrrolidone, 1,3-dimethylimidazolidinone, 3-methyloxazolidinone, carbon hydride or the like. Two or more thereof may be used by mixing. Further, the solvent may be an ionic liquid of a tetraalkyl system, a pyridinium system, or an imidazolium system quaternary ammonium salt.

A supporting electrolyte may be added into the electrolyte according to need. As the supporting electrolyte, an inorganic salt such as lithium iodide and sodium iodide, or a molten salt such as imidazolium and quaternary ammonium is cited.

Electronic devices having a rectification function similar to that of the first embodiment, specifically speaking, the rectification sections 30A to 30F composed of a rectifier are respectively electrically connected to the respective unit cells 10A to 10F in parallel. Thereby, in the battery system 1B, the reverse voltage applied to a unit cell that has lost the electromotive force is inhibited without active control as in the first embodiment. It is needless to say that the rectification sections 30A to 30F may be composed of an interface having a rectification action similar to that of the second embodiment, specifically speaking, may be composed of the Shottky interface 33.

The battery system 1B is manufactured, for example, as follows.

First, a $TiO_2$ paste containing $TiO_2$ as a semiconductor particle is prepared. That is, for example, titanium isopropoxide is slowly dropped into 0.1 M of a nitric acid aqueous solution while the solution is agitated at room temperature. The resultant solution is moved to a constant temperature bath at 80 deg C. and is agitated for 8 hours to obtain a white-turbid translucent sol solution. Next, the sol solution is cooled down to the room temperature, filtrated by a glass filter, and then messed up. The obtained sol solution is provided with hydrothermal treatment by an autoclave, and then provided with ultrasonic treatment and thereby dispersion treatment is made. Subsequently, the solution is condensed by an evaporator so that the content of $TiO_2$ is 11 wt %. Polyethylene oxide (PEO) having a molecular weight of 0.5 million is added to the condensed sol solution, the resultant is uniformly mixed by a planetary ball mill to obtain a $TiO_2$ paste with having an improved viscosity.

Next, the transparent electrode 61 made of the foregoing material is formed on the transparent substrate 60. The transparent electrode 61 is coated with the $TiO_2$ paste by, for example, screen print method, the resultant is retained for 60 minutes at 45 deg C. in the nitrogen atmosphere, and sintered. Thereby, the semiconductor electrode 62 is formed.

Subsequently, for example, the semiconductor electrode 62 is dipped in a dehydrated ethanol solution in which 0.5 mM of cis-bis(isothiocyanate)-N,N-bis(2,2'-dipyridyl-4,4'-dicarboxylic acid)-ruthenium (II) dihydrate and 20 mM of deoxycholic acid are dissolved for 12 hours. Thereby, a sensitizing dye is absorbed into the semiconductor electrode 62. After that, the semiconductor electrode 62 is washed, and dried in a dark place.

After the dye is supported by the semiconductor electrode 62, the counter electrode 71 made of the foregoing material is formed on the counter substrate 70. The transparent substrate 60 and the counter substrate 70 are oppositely arranged and the electrolyte layer 80 is formed therebetween.

In the case where the electrolyte layer 80 is a liquid electrolyte, the periphery of the transparent substrate 60 and the counter substrate 70 is sealed by using an epoxy resin, an ultraviolet curable resin, an acrylic adhesive, EVA (ethylene vinyl acetate), an ionomer resin, ceramics, a thermally fusion bonded film or the like. The liquid electrolyte is injected through an injection hole, and then the injection hole is sealed. Further, the liquid electrolyte may be gelated according to need.

Further, in the case where the electrolyte layer 80 is a gel electrolyte or a solid electrolyte, a polymer solution containing an electrolyte and a plasticizer is dropped onto the semiconductor electrode 62, and the plasticizer is completely removed. After that, the counter substrate 70 formed with the counter electrode 71 is oppositely arranged to seal the periphery.

After the respective unit cells 10A to 10F are formed as described above, the respective unit cells 10A to 10F are electrically connected to each other in series by a conductor 50. At the same time, the foregoing rectification sections 30A to 30F are respectively electrically connected to the respective unit cells 10A to 10F in parallel. Accordingly, the battery system 1B shown in FIG. 10 is fabricated.

In the battery system 1B, when light L enters from the transparent substrate 60 side, the dye supported by the semiconductor electrode 62 is excited by the light L, and an electron is moved from the dye to the semiconductor electrode 62. The dye that has lost the electron receives an electron from an ion of the electrolyte layer 80. The molecule that has given the electron receives an electron in the counter electrode 71. Meanwhile, the electron moved from the dye to the semiconductor electrode 62 is moved to the counter electrode 71 through the transparent electrode 61 and the conductor 50. Accordingly, electric energy is extracted between the transparent electrode 61 and the counter electrode 71. The foregoing rectification sections 30A to 30F are respectively electrically connected to the respective unit cells 10A to 10F in parallel. Thus, for example, when the unit cell 10C goes into the shade and loses the electromotive force, as in the first embodiment, as described with reference to FIG. 6, the current I bypasses the unit cell 10C, and is flown to the next unit cell 10D through the rectification section 30C. Thus, the reverse voltage applied to the unit cell 10C having reduced output is inhibited.

The battery system 1B provides an effect similar to that of the battery system 1 according to the first embodiment.

Fourth Embodiment

Figure 11:
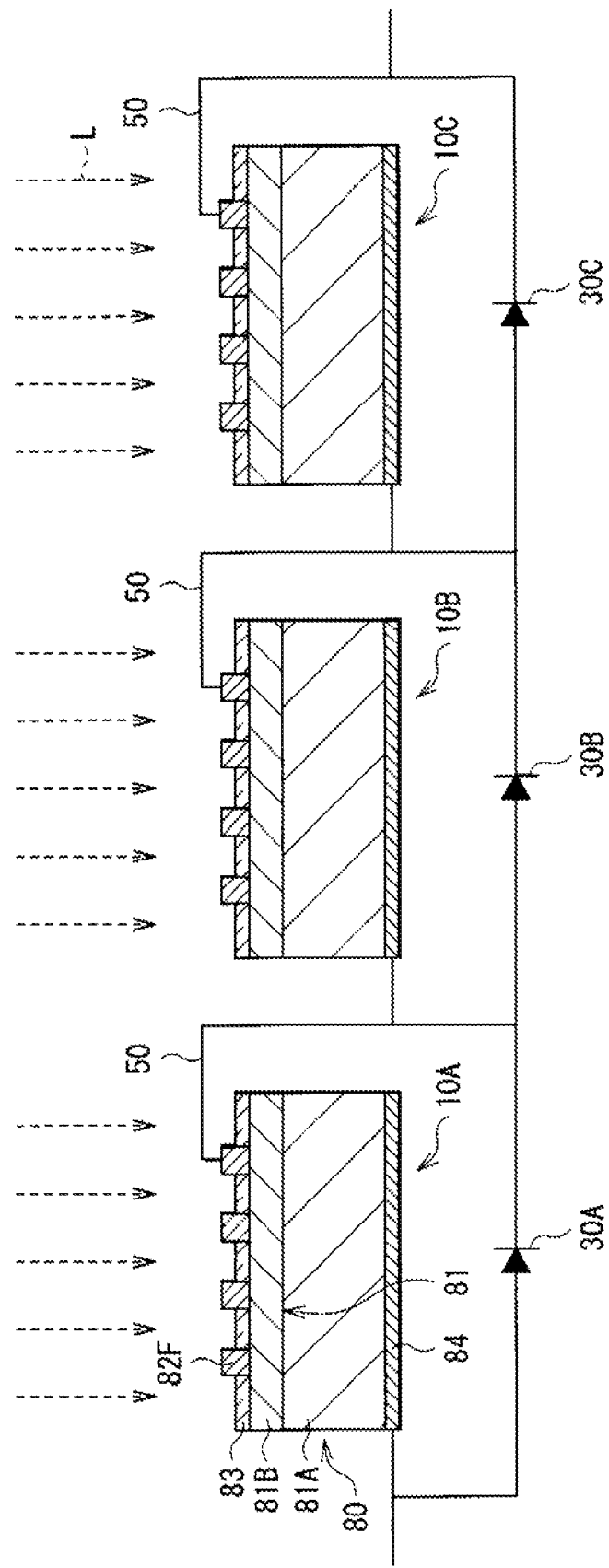
FIG. 11 is a cross section showing a configuration of a battery system according to a fourth embodiment.
Figure 12:
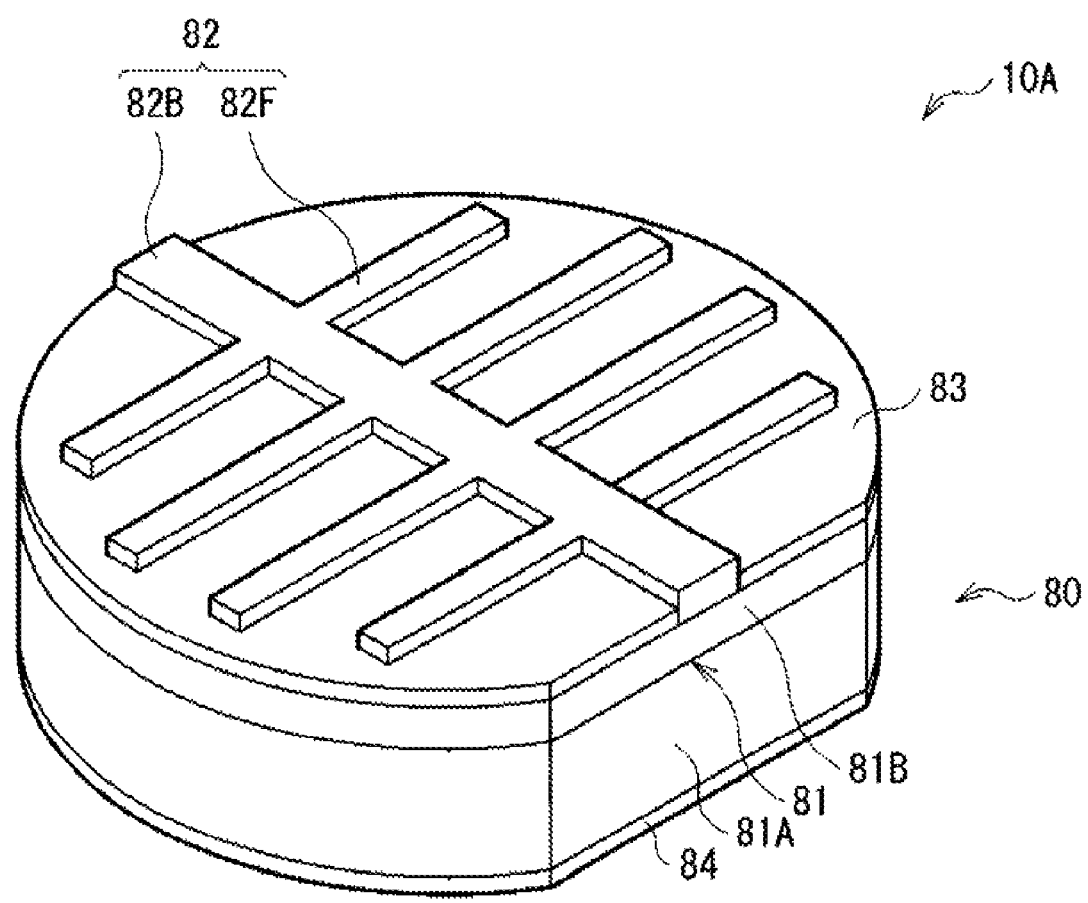
FIG. 12 is a perspective view showing a structure of the unit cell shown in FIG. 11.

FIG. 11 and FIG. 12 show a configuration of a battery system 1C according to a fourth embodiment. The battery system 1C is configured as in the battery system 1 according to the first embodiment, except that the battery system 1C is a silicon system solar cell system used for, for example, a mobile device such as a mobile phone and a PDA or a notebook PC; and the unit cells 10A to 10F (among them, since the unit cells 10D to 10F are not shown in FIG. 11, refer to FIG. 1 for them) are electrically connected to each other in series by the conductor 50. Therefore, a description will be given by using the same referential symbols for the corresponding components.

The respective unit cells 10A to 10F have, for example a pn junction 81 composed of a p-layer 81A and an n-layer 81B in the vicinity of the front face of a semiconductor substrate 80 made of p-type silicon. On the front face of the semiconductor substrate 80, a front face electrode 82 made of, for example, a silver (Ag) paste is formed. On the region of the front face of the semiconductor substrate 80 other than the front face electrode 82, a reflection preventive film 83 is provided. The front face electrode 82 has, for example, a connection electrode 82B and a current collecting electrode 82F branched out from the connection electrode 82B. On the whole area of the rear face of the semiconductor substrate 80, a rear face electrode 84 made of, for example, aluminum (Al) is formed.

Electronic devices having a rectification function similar to that of the first embodiment, specifically speaking, the rectification sections 30A to 30F composed of a rectifier are respectively electrically connected to the respective unit cells 10A to 10F in parallel. Thereby, in the battery system 1C, the reverse voltage applied to a unit cell that has lost the electromotive force is inhibited without active control as in the first embodiment. It is needless to say that the rectification sections 30A to 30F may be composed of an interface having a rectification action similar to that of the second embodiment, specifically speaking, may be composed of the Shottky interface 33.

The battery system 1C is manufactured, for example, as follows.

First, the semiconductor substrate 80 made of the foregoing material is prepared. In the vicinity of the front face of the semiconductor substrate 80, the pn junction 81 is formed by, for example, impurity diffusion. Next, the reflection preventive film 83 is formed on the whole area of the front face of the semiconductor substrate 80. Subsequently, the reflection preventive film 83 is selectively removed by, for example, etching, and the front face electrode 82 composed of the connection electrode 82B and the current collector electrode 82F is formed by, for example, silver paste screen printing. Further, on the rear face of the semiconductor substrate 80, the rear face electrode 84 made of the foregoing material is formed by, for example, screen printing.

After the respective unit cells 10A to 10F are formed as described above, the respective unit cells 10A to 10F are electrically connected to each other in series by the conductor 50. At the same time, the foregoing rectification sections 30A to 30F are respectively electrically connected to the respective unit cells 10A to 10F in parallel. Accordingly, the battery system 1C shown in FIG. 11 and FIG. 12 is fabricated.

In the battery system 1C, part of the light L entering from the front face electrode 82 side passes through the reflection preventive film 83, and is absorbed by the unit cells 10A to 10F. Part of the light passing through the unit cells 10A to 10F is reflected by the rear face electrode 84, and is absorbed by the unit cells 10A to 10F. In the p-layer 81A and the n-layer 81B that have absorbed the light L, an electron-hole pair is generated. The electron generated in the p-layer 81A is drawn by an electric field to enter the n-layer 81B. The hole generated in the n-layer 81B is drawn by the electric field to enter the p-layer 81A. Thereby, a current proportional to the incident light amount is generated and extracted through the conductor 50. The foregoing rectification sections 30A to 30F are respectively electrically connected to the respective unit cells 10A to 10F in parallel. Thus, for example, when the unit cell 10C goes into the shade and the output becomes small, as in the first embodiment, as described with reference to FIG. 6, the current I bypasses the unit cell 10C, and is flown to the next unit cell 10D through the rectification section 30C. Therefore, the reverse voltage applied to the unit cell 10C having reduced output is inhibited.

The battery system 1C provides an effect similar to that of the battery system 1 of the first embodiment.

EXAMPLE

Further, a specific example will be described. In the following example, the battery system 1 having a configuration similar to that of FIG. 1 to FIG. 3 was fabricated and the characteristics were evaluated. Therefore, in the following example, a description will be given by using the same referential symbols with reference to FIG. 1 to FIG. 3.

The battery system 1 having a configuration similar to that of FIG. 1 to FIG. 3 was fabricated. In the same manner as that of the foregoing embodiment, the battery system 1 in which 6 pieces of the DMFC type unit cells 10A to 10F are connected in series was formed, to which a variable load as the load 2 was connected. Further, Shottky diodes as the rectification sections 30A to 30F were respectively electrically connected to the respective unit cells 10A to 10F in parallel.

Figure 13:
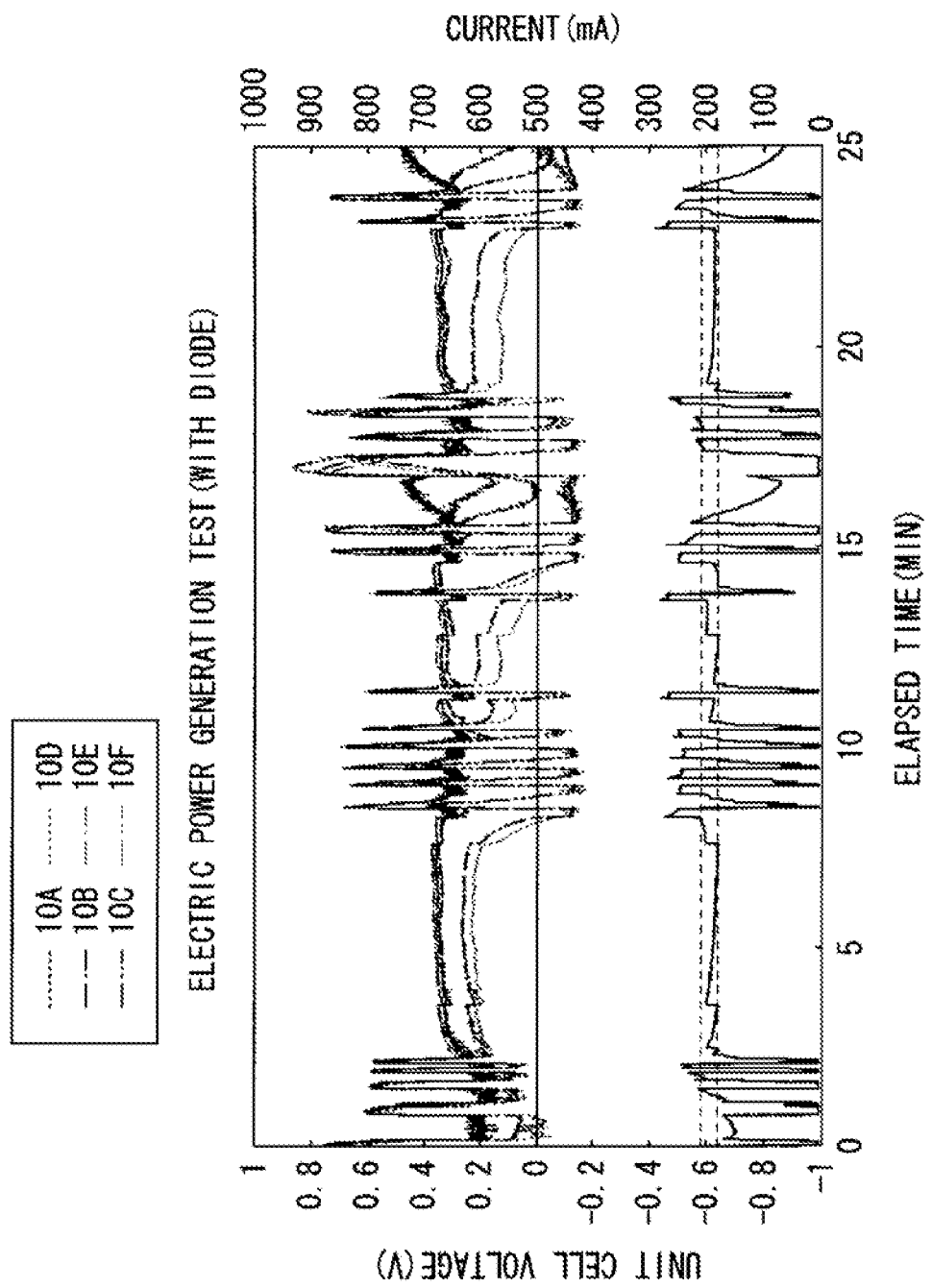
FIG. 13 is a diagram showing a result of an example according to an embodiment.

For the battery system 1, an electric power generation test was performed while the variable load was changed as appropriate in a state that the methanol supply amount to the respective unit cells 10A to 10F was varied. The current flown to the circuit and the voltage of the respective unit cells 10A to 10F were monitored and plotted. The obtained result is shown in FIG. 13. The methanol supply amount was appropriate for the unit cells 10A and 10F, excessive for the unit cells 10B and 10E, and short for the unit cells 10C and 10D.

As Comparative example, an electric power generation test was performed in the same manner as that of Example, except that the Shottky diodes were not connected to the respective unit cells 10A to 10F. The result is shown in FIG. 14.

Figure 14:
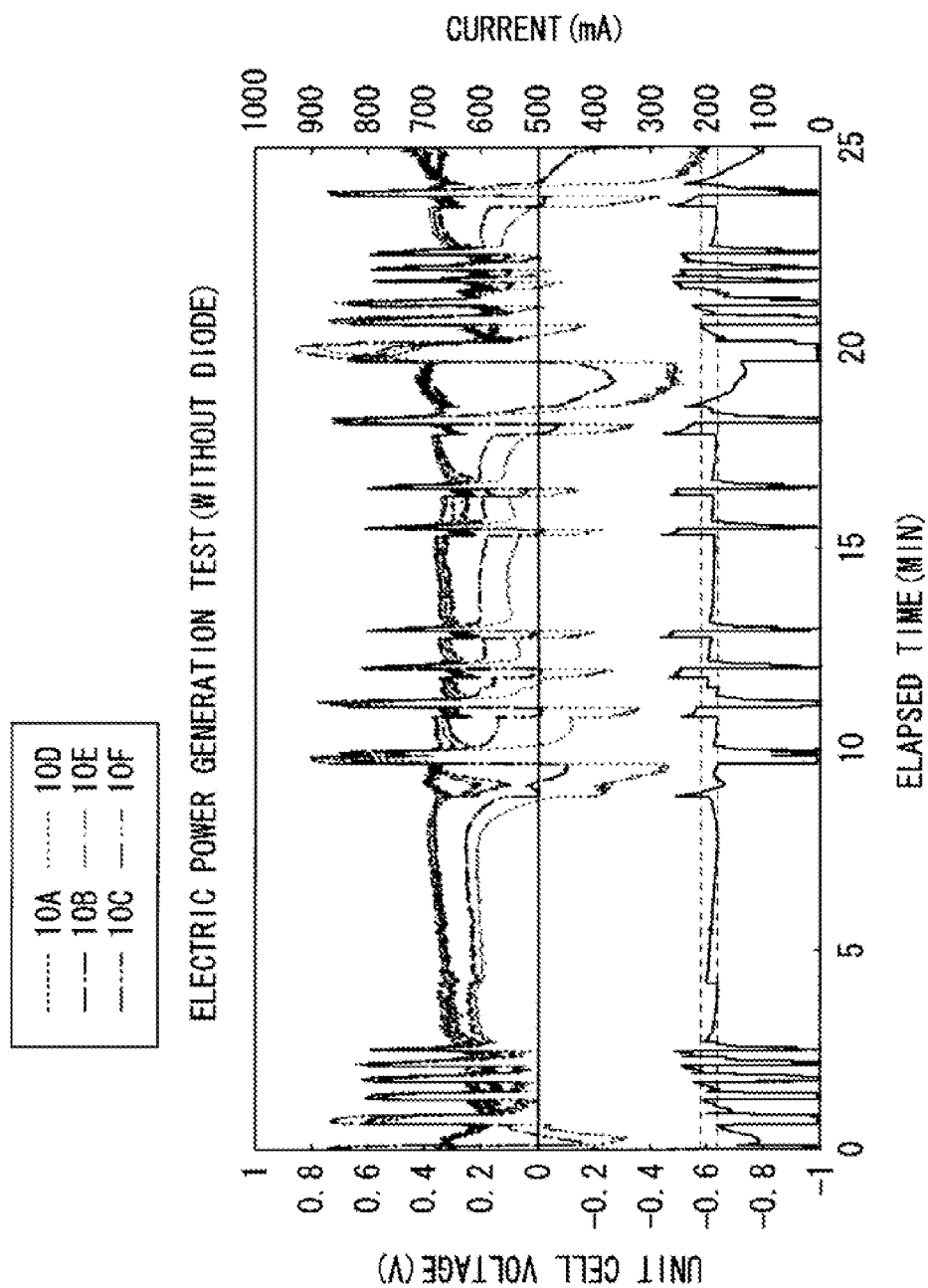
FIG. 14 is a diagram showing a result of a comparative example.

As evidenced by FIG. 13 and FIG. 14, in Example in which the Shottky diodes were connected, the output of the unit cells 10C and 10D short of the fuel was smaller than that of the other unit cells 10A, 10B, 10E, and 10F, while the reverse voltage could be kept to under −0.2 V. Meanwhile, in Comparative example in which the Shottky diodes were not connected, the output of the unit cells 10C and 10D short of the fuel was lowered down to around −0.6 V. That is, it was found that in the case where the rectification sections 30A to 3OF composed of the Shottky diode were respectively electrically connected to the respective unit cells 10A to 10F in parallel, the reverse voltage applied to the unit cells 10C and 10D that have lost electromotive force could be inhibited without active control.

The present application has been described with reference to the embodiments and the example. However, the present application is not limited to the foregoing embodiments and the foregoing example, and various modifications may be made. For example, in the foregoing embodiments and the foregoing example, the descriptions have been given of the case that the rectification sections 30A to 30F are composed of a rectifier specifically as an electronic device having a rectification function. However, the rectification sections 30A to 30F may be composed of other device having a rectification function, such as a 2-terminal field-effect transistor and a 2-terminal polar transistor.

Further, for example, in the foregoing second embodiment, the rectification sections 30A to 30F including the Shottky interface 33 were formed between the connection members 20. However, the Shottky interface 33 may be buried inside the respective unit cells 10A to 10F.

Further, the material and the thickness of each component, the electric power generation conditions of the fuel cell and the like are not limited to those described in the foregoing embodiments. Other material, other thickness, or other electric power generation conditions may be adopted.

In addition, in the foregoing embodiments, the fuel tank 40 is an encapsulated type tank, and the liquid fuel 41 is supplied according to need. However, the fuel may be supplied from a fuel supply section (not shown) to the fuel electrode 12. Further, for example, the liquid fuel 41 may be other liquid fuel such as ethanol and diethyl ether in addition to methanol.

Furthermore, the present application is applicable not only to the fuel cell using the liquid fuel, but also to a fuel cell using a substance as a fuel other than the liquid fuel such as hydrogen.

The battery system may be suitably used for a portable electronic device such as a mobile phone, an electrophotographic device, an electronic diary, a notebook personal computer, a camcorder, a portable game device, a portable videoplayer, a headphone stereo, and a PDA.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A battery system comprising:
   two or more unit cells electrically connected in series; and
   a rectification section that is composed of at least one of an electronic device having a rectification function and an interface having a rectification action, and is electrically connected to the respective two or more unit cells in parallel, wherein
   the two or more unit cells are electrically connected in series by a plurality of connection members containing a first metal;
   a metal layer containing a second metal and being joined to one of the plurality of connection members, and a semiconductor layer being joined to other one of the plurality of connection members are formed between the plurality of connection members; and the interface having a rectification action is a Schottky interface formed between the semiconductor layer and the other one of the plurality of connection members or the metal layer.

2. The battery system according to claim 1, wherein a voltage drop amount in the rectification section is 0.5 V or less.

3. The battery system according to claim 1, wherein the electronic device having a rectification function is a diode.

4. The battery system according to claim 3, wherein the rectifier is a Schottky diode.

5. The battery system according to claim 1, wherein the interface having a rectification action is a metal-semiconductor interface.

6. The battery system according to claim 1, wherein the unit cell is a fuel cell.

7. The battery system according to claim 1, wherein the unit cell is a solar cell.

* * * * *